(12) United States Patent
Li et al.

(10) Patent No.: US 11,432,428 B2
(45) Date of Patent: Aug. 30, 2022

(54) CHASSIS AND ELECTRONIC DEVICE APPLYING THE CHASSIS

(71) Applicant: Celestica Technology Consultancy (Shanghai) Co. Ltd, Shanghai (CN)

(72) Inventors: Wenjin Li, Shanghai (CN); Yuan Xue, Shanghai (CN); Alonzo Ramirez, Hudson, NH (US)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 17/035,759

(22) Filed: Sep. 29, 2020

(65) Prior Publication Data

US 2021/0345514 A1 Nov. 4, 2021

(51) Int. Cl.
*G06F 1/18* (2006.01)
*H05K 7/14* (2006.01)
*G06F 1/20* (2006.01)
*H05K 7/20* (2006.01)

(52) U.S. Cl.
CPC ........... *H05K 7/1492* (2013.01); *G06F 1/187* (2013.01); *G06F 1/189* (2013.01); *G06F 1/206* (2013.01); *H05K 7/1474* (2013.01); *H05K 7/20736* (2013.01)

(58) Field of Classification Search
CPC .. G06F 1/184; G06F 1/187–189; G06F 1/206; H05K 7/1438; H05K 7/1439; H05K 7/1441; H05K 7/1442; H05K 7/1474; H05K 7/1494; H05K 7/20736
See application file for complete search history.

(56) References Cited

U.S. PATENT DOCUMENTS

| 5,528,460 | A   | * | 6/1996  | Byrd ................. | H01M 50/213 |
|-----------|-----|---|---------|-----------------------|-------------|
|           |     |   |         |                       | 429/96      |
| 10,445,276 | B2 | * | 10/2019 | Cheng ................ | G06F 13/4282 |
| 10,743,434 | B1 | * | 8/2020  | Xu ...................... | H05K 7/1438 |
| 2008/0148303 | A1 | * | 6/2008 | Okamoto ............. | G11B 33/128 |
|           |     |   |         |                       | 720/652     |
| 2015/0181746 | A1 | * | 6/2015 | Mullen ................ | H05K 7/1487 |
|           |     |   |         |                       | 361/752     |
| 2016/0041590 | A1 | * | 2/2016 | Yu ......................... | G06F 1/186 |
|           |     |   |         |                       | 361/679.32  |
| 2017/0027073 | A1 | * | 1/2017 | Zani ..................... | H05K 7/1487 |
| 2017/0168975 | A1 | * | 6/2017 | Heinrichs ............. | H05K 7/1492 |

FOREIGN PATENT DOCUMENTS

| CN | 206726123 U | * | 12/2017 |
| CN | 210428236 U | * | 4/2020 |

* cited by examiner

*Primary Examiner* — Adrian S Wilson
*Assistant Examiner* — Gage Crum (57) ABSTRACT

The present disclosure provides a chassis and an electronic device applying the chassis. The chassis includes: a chassis body; the chassis body is a 2U chassis body or a 4U chassis body; a hard disk module, installed in a front end area of the chassis body; a power supply module, installed at one side of a rear end area of the chassis body; a controller module, installed in a remaining rear end area of the chassis body except the power supply module, parallel with the power supply module, and including a plurality of pluggable functional modules; a middle board, connected with the power supply module, the hard disk module, and the control module, respectively, to realize the electrical connection between the power supply module, the hard disk module, and the control module. The present disclosure can improve the versatility of the chassis modules.

8 Claims, 10 Drawing Sheets

CHASSIS AND ELECTRONIC DEVICE APPLYING THE CHASSIS

CROSS REFERENCES TO RELATED APPLICATIONS

This application claims the benefits of priority to Chinese Patent Application No. CN2020103556490, entitled "Chassis and Electronic Device Applying the Chassis", filed with CNIPO on Apr. 29, 2020, and Chinese Patent Application No. CN 2020206881348, entitled "Chassis and Electronic Device Applying the Chassis", filed with CNIPO on Apr. 29, 2020, the contents of which are incorporated herein by reference in their entireties.

TECHNICAL FIELD

The present disclosure relates to the technical field of servers or storages, and in particular to a chassis and an electronic device applying the chassis.

BACKGROUND

With the development of the communication industry, the requirements for the structural design of communication equipment, especially equipment with high-density and high-performance, become higher. In order to achieve more functions, the existing communication equipment always has a lot of electronic modules in the chassis. Therefore, it becomes a developing direction of the communication equipment to layout the modules in a limited space reasonably and for maximization, to improve the versatility of each module, so as to improve the cost-effectiveness of the product and bring a better user experience.

SUMMARY

The present disclosure provides a chassis and an electronic device applying the chassis for optimizing the module layout in the chassis and improving the versatility of the chassis modules.

The present disclosure provides a chassis, the chassis includes: a chassis body, the chassis body is a 2U chassis body or a 4U chassis body; a hard disk module, installed in a front end area of the chassis body; a power supply module, installed at one side of a rear end area of the chassis body; a controller module installed in a remaining rear end area of the chassis body except the power supply module, in parallel with the power supply module, and including a plurality of pluggable functional modules; a middle board, connected with the power supply module, the hard disk module, and the control module, respectively, to realize the electrical connection between the power supply module, the hard disk module, and the control module.

In an embodiment of the present disclosure, in the 2U chassis body, the hard disk module includes 0 to 24 hard disk units arranged in the front end area of the chassis body; the power supply module includes two stacked power supply units; the controller module includes two half-width controllers, a width of the controller is half of a width of the remaining rear end area.

In an embodiment of the present disclosure, the half-width controller includes: a main board, U-shaped housing side plates arranged on both sides of the main board, a battery backup module arranged at one end of the main board, the battery backup module provides power supply when power is off, two stacked M.2 interface modules adjacent to the battery backup module, two PCI-E modules parallel with the battery backup module and the two M.2 interface modules, a plurality of dual-inline-memory modules, a CPU module and three fan modules arranged in the middle of the main board.

In an embodiment of the present disclosure, in the 2U chassis body, the hard disk module includes 0 to 24 hard disk units arranged in the front end area of the chassis body; the power supply module includes two stacked power supply units; the controller module includes a full-width controller with a width equal to a width of the remaining rear end area.

In an embodiment of the present disclosure, the middle board includes: a first adapter board and a second adapter board respectively connected with the two power supply units, a power supply backplane connected with the first adapter board and the second adapter board, and a connection backplane respectively connected with the power supply backplane, the hard disk module, and the controller module.

In an embodiment of the present disclosure, in the 4U chassis body, the hard disk module includes two layers of stacked hard disk sub-modules arranged in the front end area of the chassis body, and the hard disk sub-modules include 0 to 48 hard disk units; the power supply module includes two layers of stacked power supply sub-modules installed at one side of the rear end area of the chassis body, and each layer of the power supply sub-module includes two stacked power supply units; the controller module includes two layers of controller sub-modules installed in a remaining rear end area of the chassis body except the power supply module, and in parallel with the power supply module, each of the controller sub-modules includes a full-width controller with a width equal to a width of the remaining rear end area.

In an embodiment of the present disclosure, the full-width controller includes: a main board, U-shaped housing side plates arranged on both sides of the main board, two parallel battery backup modules arranged in the middle of an end of the main board to provide power supply when power is off, two M.2 interface modules arranged side by side under each of the battery backup modules, four PCI-E modules arranged outside and parallel with the battery backup module, and a plurality of dual-inline-memory modules, two CPU module and five fan modules arranged in the middle of the main board.

In an embodiment of the present disclosure, the middle board includes: a first adapter board, a second adapter board, a third adapter board, and a fourth adapter respectively connected with the four power supply units, a power supply backplane connected with the first adapter board, the second adapter board, the third adapter board, and the fourth adapter board, and a connection backplane connected with the power supply backplane, the hard disk module, and the controller module.

In an embodiment of the present disclosure, the functional modules in the half-width controller and the full-width controller have the same size; the 2U chassis body and the 4U chassis body both includes full-width controller.

The present disclosure further provides an electronic device applying the above-mentioned chassis.

As mentioned above, the chassis and the electronic device applying the chassis of the present disclosure have the following beneficial effects:

1. In the present disclosure, the functional modules in the controller in the chassis are pluggable, so that the functional modules are shared, which can be pulled out directly from the back of the chassis, the modules in different chassis can be exchanged. In addition, the full-width controllers in the 2U chassis and 4U chassis can be exchanged, which improves the versatility of the chassis modules.

2. In the present disclosure, the electrical connection between the power supply, the hard disk and the controller is realized through a middle board with electronic functions, so that the internal layout of the chassis is reasonable, simple and clean.

COMPONENT REFERENCE NUMERALS

100 Chassis
110 Hard disk module
111 Hard disk unit
120 Power supply module
121~124 Power supply unit
130 Controller module
131 Half-width controller
1301, 1302 U-shaped housing side plate
1311 Main board
1312 Battery backup module
1313 M.2 interface module
1314 PCI-E module
1315 Dual-inline-memory module
1316 CPU module
1317 Connector module
1318 Fan module
1319 Interface module
132 Full-width controller
1301, 1302 U-shaped housing side plate
1303 Connector module
1321 Main board
1322 Battery backup module
1323 M.2 interface module
1324 PCI-E module
1325 Dual-inline-memory module
1326, 1327 CPU module
1328 Fan module
1329 Interface module
140 Middle board
141 First adapter board
142 Second adapter board
143, 145 Power backplane
144, 146 Connection backplane
147 Third adapter board
148 Fourth adapter board

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1 to 19. It should be understood that the structures, proportions, sizes, and the like, which are illustrated in the drawings of the present specification, are only used to clarify the contents disclosed in the specification for understanding and reading by the person skilled in the field, and are not intended to limit the scope of the present disclosure, thus are not technically meaningful. Any modification of the structure, change of the scale, or adjustment of the size without affecting the effects and achievable objectives of the present disclosure should still fall within the scope of the technical contents disclosed by the present disclosure. In the meantime, the terms "upper", "lower", "left", "right", "middle" and "one" as used in this specification are only for convenience of description, and are not intended to limit the scope of the present disclosure, and the change or adjustment of the relative relationship is considered to be within the scope of the present disclosure without substantial changes in technology.

The present disclosure provides a chassis and an electronic device applying the chassis, to solve the problems that the dual CPUs arrangement affects the length of the chassis, the number of CPUs and the heat dissipation performance.

The following will elaborate a chassis and an electronic device applying the chassis, so that those skilled in the art can understand the chassis and the electronic device applying the chassis.

Embodiment 1

Figure 1:
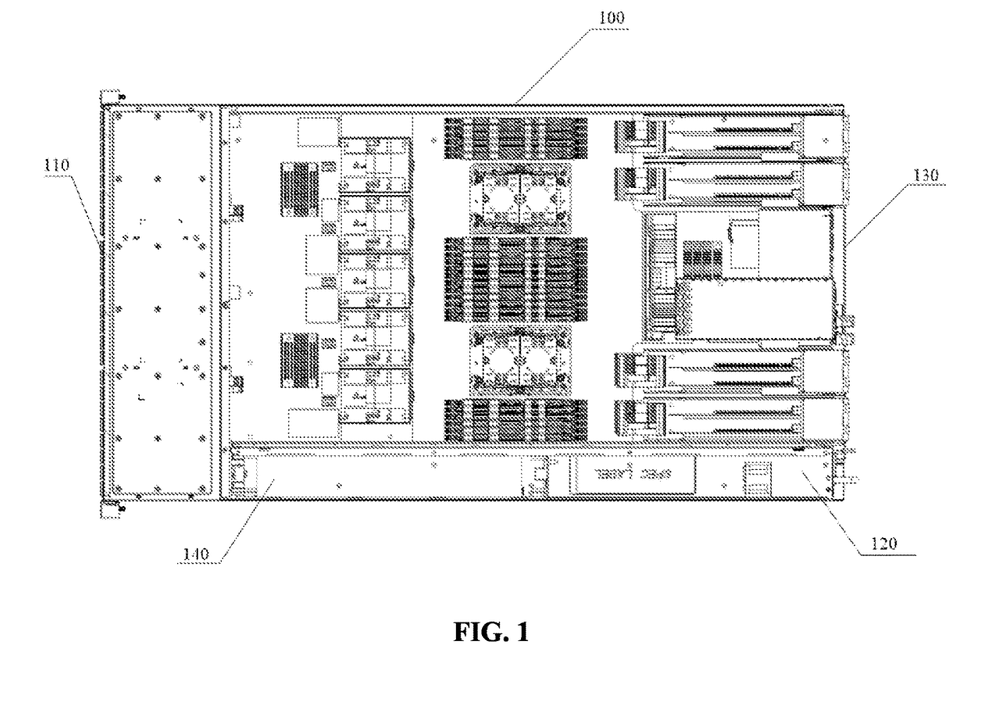
FIG. 1 is a top view of a chassis equipped with two half-width controllers in the present disclosure.

As shown in FIG. 1, this embodiment provides a chassis 100. The chassis 100 includes a chassis body, a hard disk module 110, a power supply module 120, a controller module 130, and a middle board 140.

In this embodiment, the chassis 100 is a 2U chassis, and the chassis body is a 2U chassis body.

"U" is a unit that represents the external dimensions of the chassis 100 and is an acronym for unit. The detailed dimensions are determined by an industry group: the Electronic Industries Association (EIA).

The reason for specifying the size of the chassis 100 is to keep the chassis 100 at an appropriate size so as to be placed on an iron or aluminum rack. The rack includes screw holes for fixing the chassis 100. The screw holes of the rack are aligned with the screw holes of the chassis 100, and are fixed with screws. The prescribed size of the chassis 100 includes a width (48.26 cm=19 inches) and a height (multiples of 4.445 cm). 1U is 4.445 cm, and 2U is twice that of 1U, which is 8.89 cm.

In this embodiment, the hard disk module 110 is installed in the front end area of the chassis body.

Figure 2:
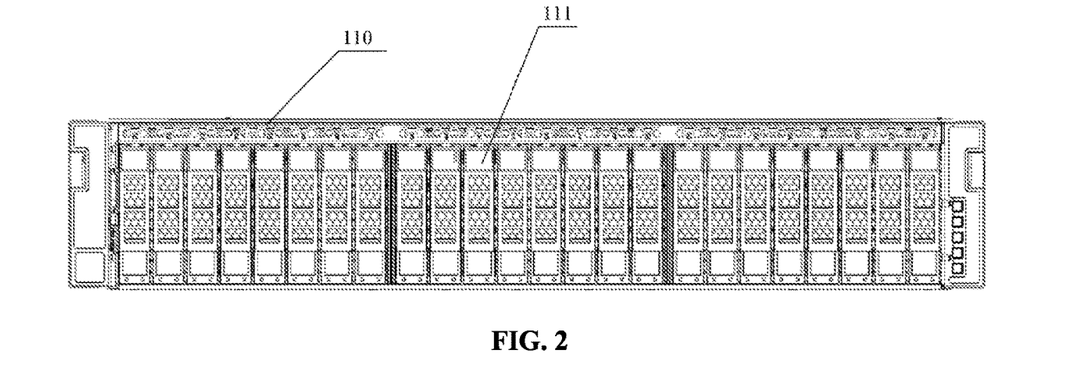
FIG. 2 is a schematic diagram of the front end of the 2U chassis in the present disclosure.

Specifically, as shown in FIG. 2, in the 2U chassis body, the hard disk module 110 includes 0 to 24 hard disk units 111 arranged in the front end area of the chassis body. That is, in this embodiment, the hard disk module 110 includes up to 24 hard disks. The arrangement of the hard disk units 111 in the chassis body is shown in FIG. 2. Preferably, the hard disk units 111 are arranged side-by-side.

In this embodiment, as shown in FIGS. 3 to 6, in this embodiment, the power supply module 120 is installed at one side of the rear end area of the chassis body. In this embodiment, the controller module 130 is installed in the remaining rear end area of the chassis body except the power supply module 120, in parallel with the power supply module 120, and including a plurality of pluggable functional module.

Figure 3:
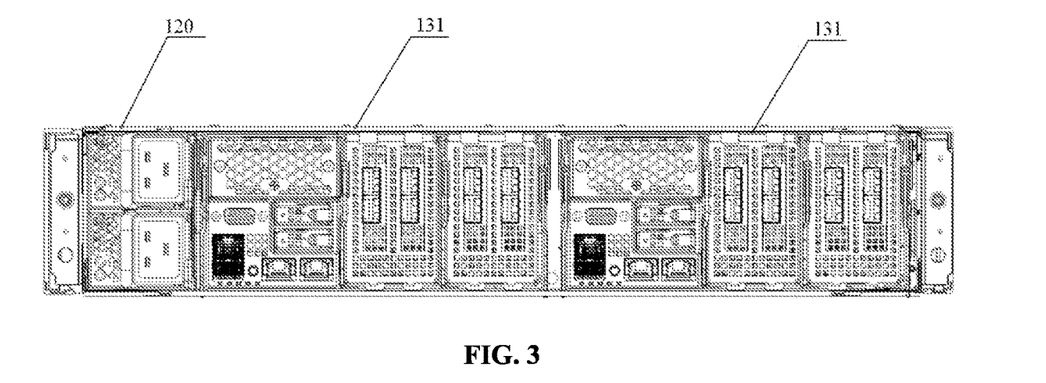
FIG. 3 is a schematic diagram of the rear end when the 2U chassis includes two half-width controllers in the present disclosure.
Figure 4:
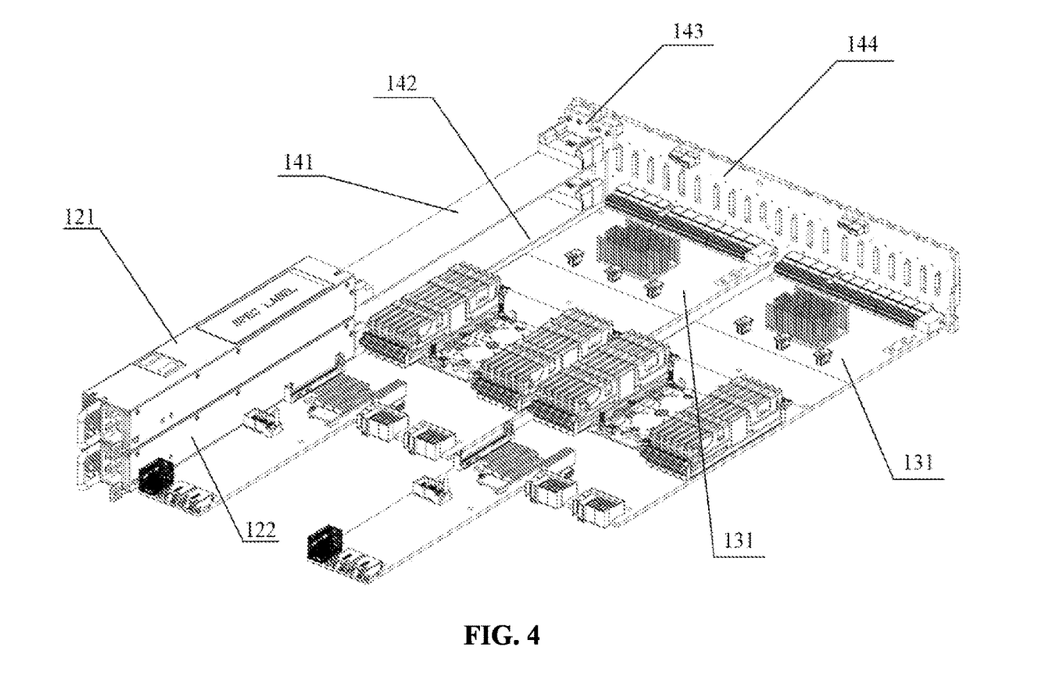
FIGS. 4 and 5 are schematic diagrams of the internal connection when the 2U chassis includes two half-width controllers in the present disclosure.
Figure 5:
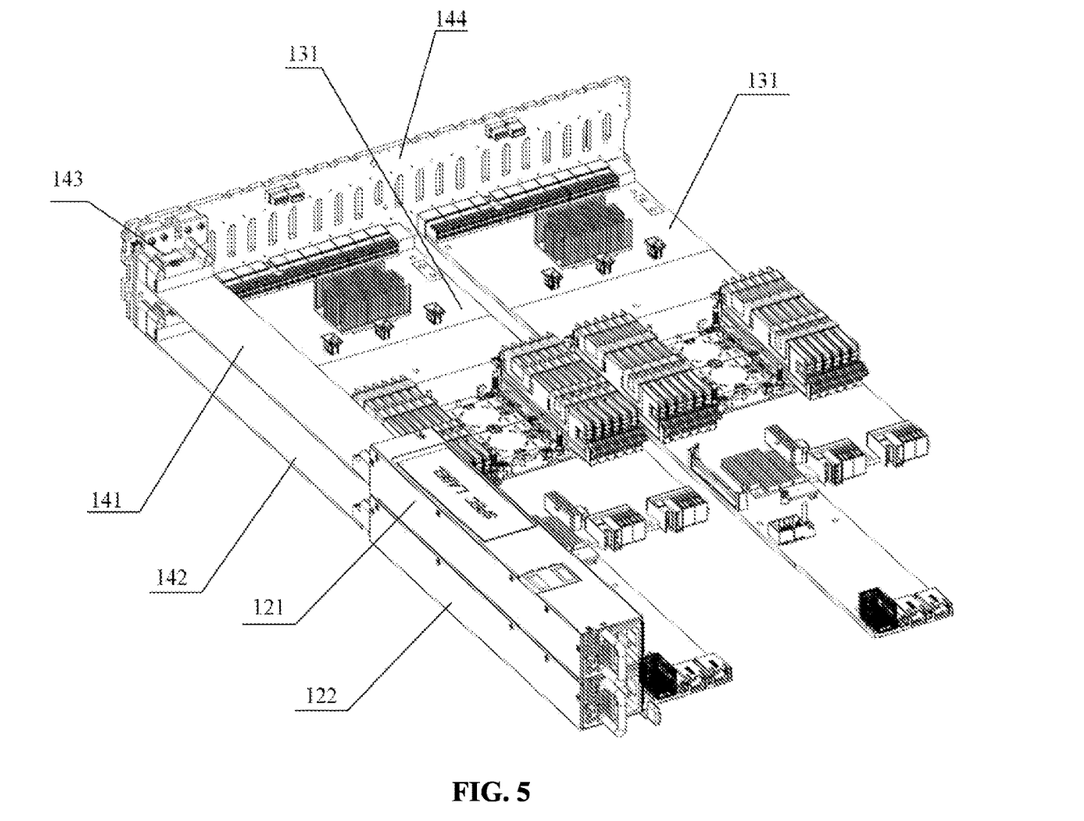
Figure 6:
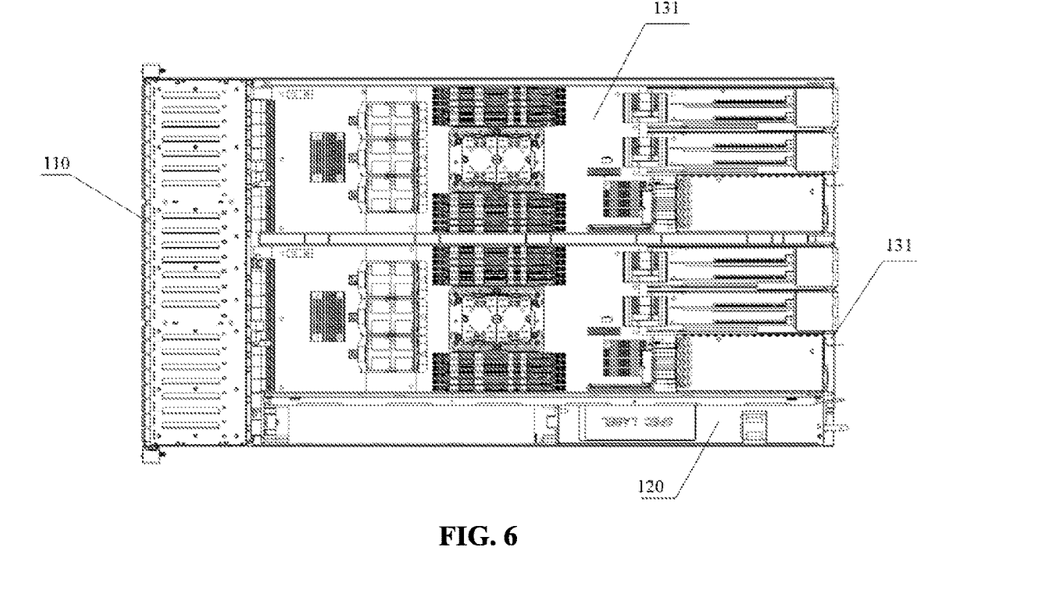
FIG. 6 is a top view of the 2U chassis in the present disclosure.

Specifically, as shown in FIGS. 3 to 5, the power supply module 120 includes two stacked power supply units: a power supply unit 121 and a power supply unit 122. The controller module 130 includes two half-width controllers 131, a width of the half-width controller 131 is half the remaining width of the rear end area. In other words, the power supply module 120 and the half-width controller 131 are arranged side by side.

That is, in this embodiment, a 2U chassis 100 supports 24 or less, or no hard disks (solid state disk (SSD)) at the front end, and supports two power supply modules (PSU) 120 and two half-width controllers 131 at the rear end.

Figure 7:
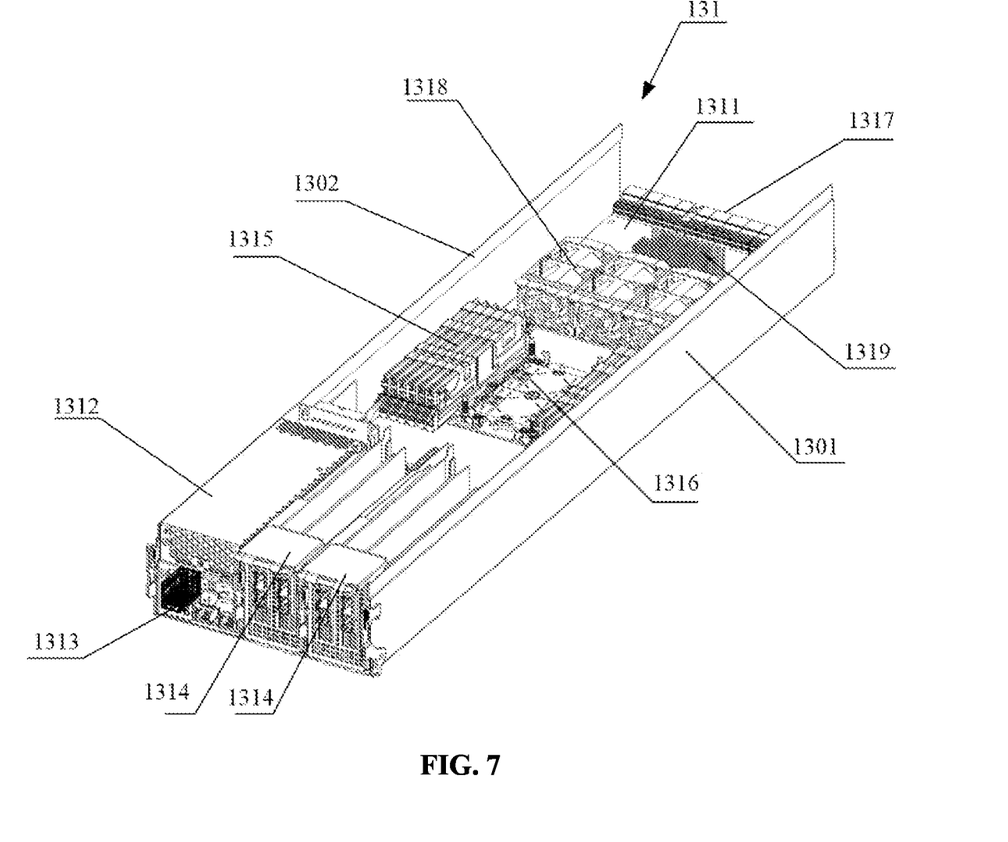
FIG. 7 is a schematic diagram of the front end of the half-width controller in the chassis of the present disclosure.
Figure 8:
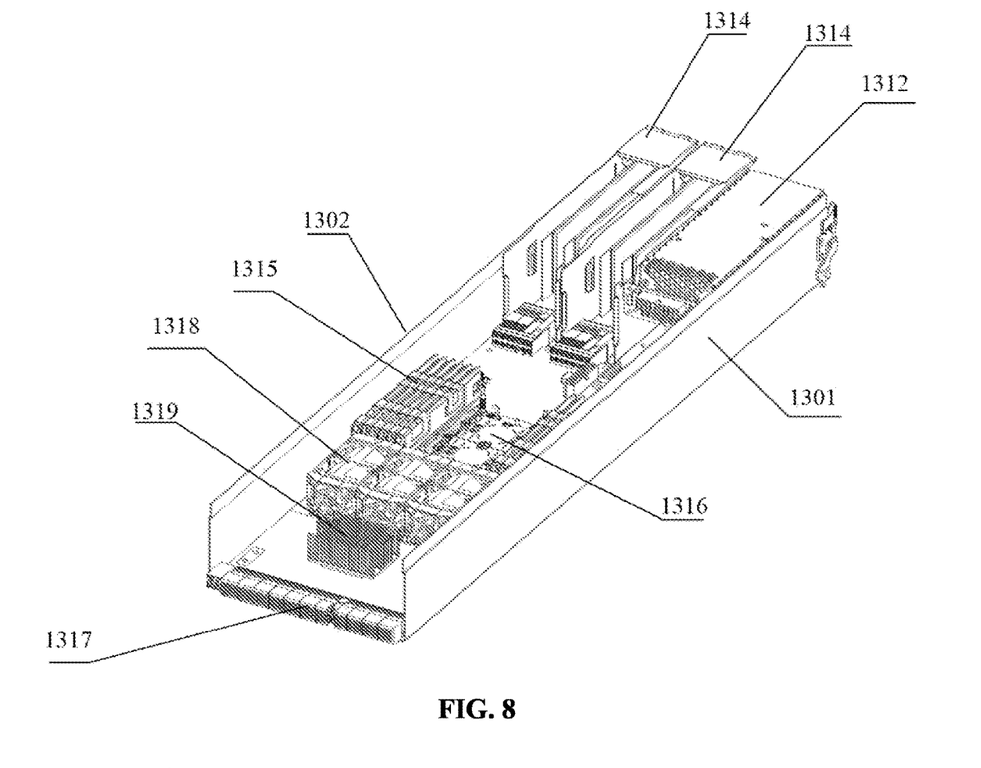
FIG. 8 is a schematic diagram of the rear end of the half-width controller in the chassis of the present disclosure.
Figure 9:
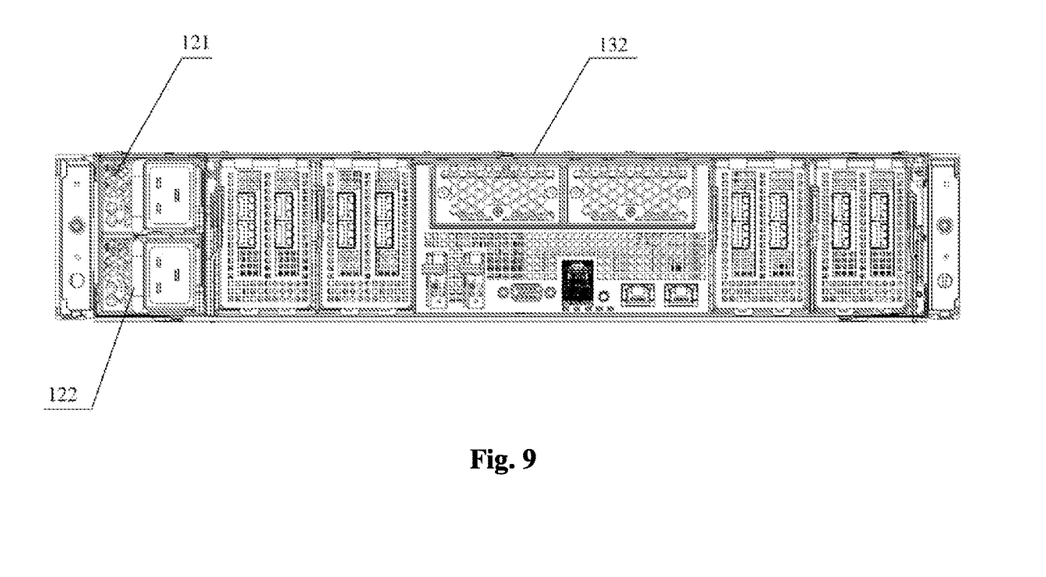
FIG. 9 is a schematic diagram of the rear end when the 2U chassis includes a full-width controller in the present disclosure.
Figure 10:
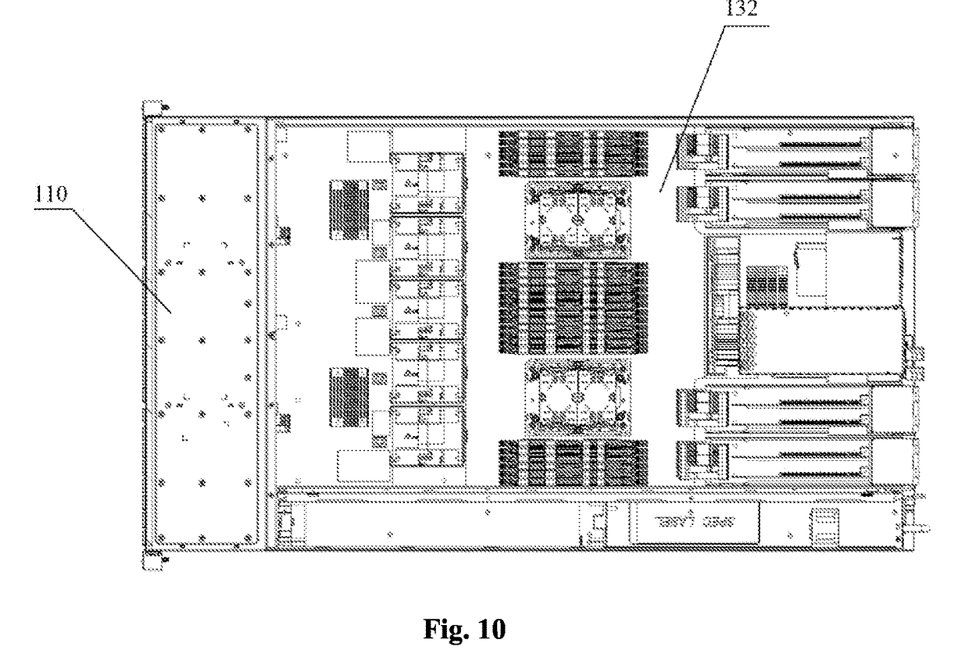
FIG. 10 is a top view of the 2U chassis including a full-width controller in the present disclosure.

In this embodiment, as shown in FIGS. 7 and 8, the half-width controller 131 includes: a main board 1311, U-shaped housing side plates (a side plate 1301 and a side plate 1302) arranged on both sides of the main board 1311, a battery backup module 1312 (BBU module) arranged at one side of the main board 1311, the BBU module provides power supply when power is off, two stacked M.2 1313 interface modules 1313 adjacent to the BBU module, two PCI-E modules 1314 parallel with the BBU module 1312 and the M.2 interface module 1313, and a plurality of dual-inline-memory modules 1315 (DIMMs), preferably 12 DIMMs 1315, a CPU module 1316, and three fan modules 1318 arranged in the middle of the main board 1311. In addition, the half-width controller 131 further includes an interface module 1319 for connecting with external devices, and a connector module 1317 for connecting with the middle board 140.

The plurality of pluggable functional modules: the BBU module 1312, the M.2 interface module 1313, the PCI-E module 1314, the DIMM 1315, the CPU module 1316 and the fan modules 1318 are all snap-fit structures, which are pluggably connected with the main board 1311 through golden fingers or connectors, and can be disassembled and assembled with bare hands. The modules can be taken out of the chassis 100 directly when replacing or maintaining.

The functional modules in the half-width controller 131 in the 2U chassis 100 are pluggable, the functional module are shared, which can be pulled out directly from the rear end of the 2U chassis 100, making the modules in the controller of the 2U chassis 100 can be exchanged, so as to improve the versatility of the modules in the chassis 100.

In this embodiment, the controller module 130 is connected with the middle board 140 through connector interfaces. For example, the connector interface of the controller module 130 is a male interface, and the connector interface of the middle board 140 is a female interface. The controller module 130 is connected with the middle board 140 by the mating connection of the male interface and the female interface.

In this embodiment, the middle board 140 is connected with the power supply module 120, the hard disk module 110, and the control module, respectively, so as to realize the electrical connection of the power supply module 120, the hard disk module 110, and the control module.

FIGS. 4 and 5 show schematic diagrams of the connection between the middle board 140 and the power supply module 120 and the two half-width controllers 131. Specifically, in this embodiment, as shown in FIGS. 4 and 5, the middle board 140 includes: a first adapter board 141 and a second adapter board 142 connected with the two power supply units (the power supply unit 121 and the power supply unit 122) respectively, a power backplane 143 connected with the first adapter board 141 and the second adapter board 142 respectively, and a connection backplane 144 connected with the power backplane 143, the hard disk module 110 and the two half-width controllers 131.

The connection backplane 144 includes a connector connected with the hard disk module 110, a connector connected with the half-width controller 131, and heat dissipation holes for heat dissipation.

In this embodiment, the first adapter board 141 and the second adapter board 142 are respectively connected with a power supply unit, the power supply unit 121 and the power supply unit 122 are respectively connected with the power backplane 143, the power supply is connected with the hard disk module 110 and the half-width controller 131 on the connection backplane 144 through the power backplane 143.

Therefore, in this embodiment, the middle board 140 with electronic functions realizes the electrical connection between the power supply, the hard disk and the two half-width controllers 131, the internal layout of the chassis 100 is reasonable, simple and clean.

Embodiment 2

As shown in FIG. 1, this embodiment provides a chassis 100. The chassis 100 includes a chassis body, a hard disk module 110, a power supply module 120, a controller module 130, and a middle board 140.

In this embodiment, the chassis 100 is a 2U chassis, and the chassis body is a 2U chassis body.

In this embodiment, the hard disk module 110 is installed in the front end area of the chassis body.

Specifically, as shown in FIG. 2, in the 2U chassis body, the hard disk module 110 includes 0 to 24 hard disk units 111 arranged in the front end area of the chassis body. That is, in this embodiment, the hard disk module 110 includes up to 24 hard disks. The arrangement of the hard disk units 111 in the chassis body is shown in FIG. 2. Preferably, the hard disk units 111 are arranged side-by-side.

In this embodiment, as shown in FIGS. 9 to 12, the power supply module 120 is installed at one side of the rear area of the chassis. In this embodiment, the controller module 130 is installed in the remaining rear end area of the chassis body except the power supply module 120, in parallel with the power supply module 120, and including a plurality of pluggable functional modules.

Specifically, as shown in FIGS. 9 to 12, the power supply module 120 includes two stacked power supply units: a power supply unit 121 and a power supply unit 122. The controller module 130 includes a full-width controller 132 with a width equal to the remaining width of the rear end area. In other words, the power supply module 120 and the full-width controller 132 are arranged side by side.

That is, in this embodiment, a 2U chassis 100 supports 24 or less, or no hard disks (solid state disk (SSD)) at the front end, and supports two PSU modules 120 and a full-width controller 132 at the rear end.

Figure 13:
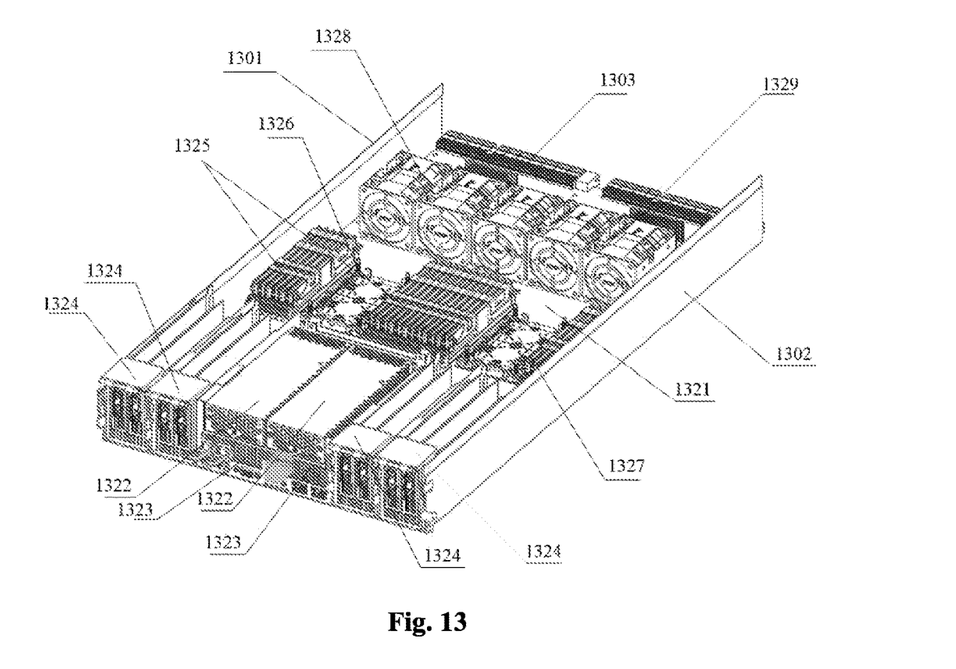
FIG. 13 is a schematic diagram showing the front end of the full-width controller in the 2U and 4U chassis of the present disclosure.
Figure 14:
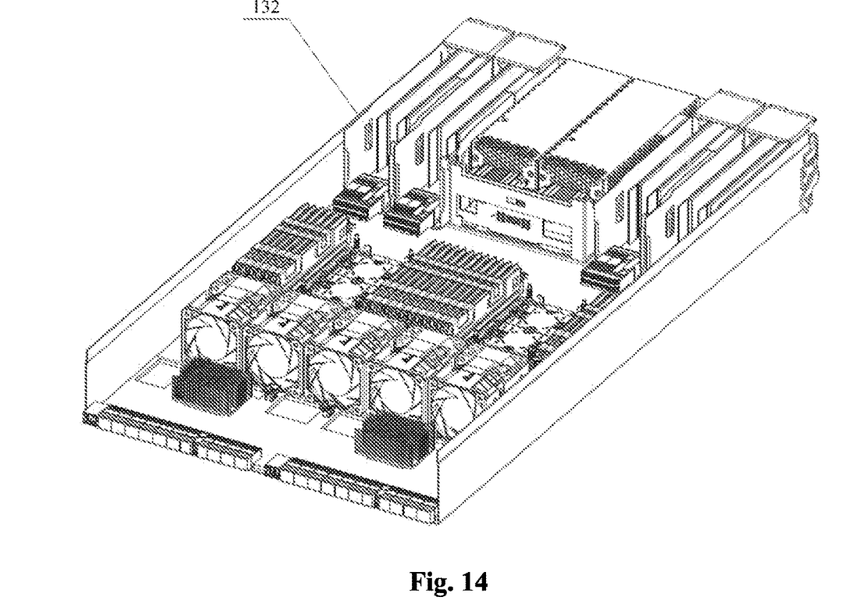
FIG. 14 is a schematic diagram of the rear end of the full-width controller in the 2U and 4U chassis of the present disclosure.

In this embodiment, as shown in FIGS. 13 to 14, the full-width controller 132 includes: a main board 1321, and U-shaped housing side plates (a side plate 1301 and a side plate 1302) arranged on two sides of the main board 1321, two parallel BBU modules 1322 arranged in the middle of an end of the main board 1321 to provide power supply when power is off, two M.2 interface modules 1323 arranged side by side under each of the BBU modules, four PCI-E modules 1324 arranged outside and parallel with the BBU module 1322, a plurality of DIMMs 1325, preferably 24 DIMMs, two CPU modules (a CPU module 1326 and a CPU module 1327), and five fan modules 1328 arranged in the middle of the main board 1321. The full-width controller 132 includes: a main board 1321, and U-shaped housing side plates (a side plate 1301 and a side plate 1302) arranged on both sides of the main board 1321. In addition, the full-width controller 132 further includes an interface module 1329 for connecting with external devices, and a connector module 1303 for connecting with the middle board 140.

The plurality of pluggable functional modules: the BBU module 1322, the M.2 interface module 1323, the PCI-E module 1324, the DIMM 1325, the CPU module and the fan modules 1328 are all snap-fit structures, which are pluggably connected with the main board 1321 through golden fingers or connectors, and can be disassembled and assembled with bare hands. The modules can be taken out of the chassis 100 directly when replacing or maintaining.

In this embodiment, the structural size of each corresponding functional module in the full-width controller 132 is the same as the structural size of each corresponding functional module in the half-width controller 131 in Embodiment 1. The functional modules in the full-width controller 132 in the 2U chassis 100 are pluggable, the functional module are shared, which can be pulled out directly from the rear end of the 2U chassis 100, making the modules in the controller of the 2U chassis 100 can be exchanged, so as to improve the versatility of the modules in the chassis 100.

In this embodiment, the full-width controller 132 is connected the middle board 140 through connector interfaces. For example, the connector interface of the full-width controller 132 is a male interface, and the connector interface of the middle board 140 is a female interface. The full-width controller 132 is connected with the middle board 140 by the mating connection of the male interface and the female interface.

In this embodiment, the middle board 140 is connected with the power supply module 120, the hard disk module 110, and the control module, respectively, so as to realize the electrical connection of the power supply module 120, the hard disk module 110, and the full-width control 132.

Figure 11:
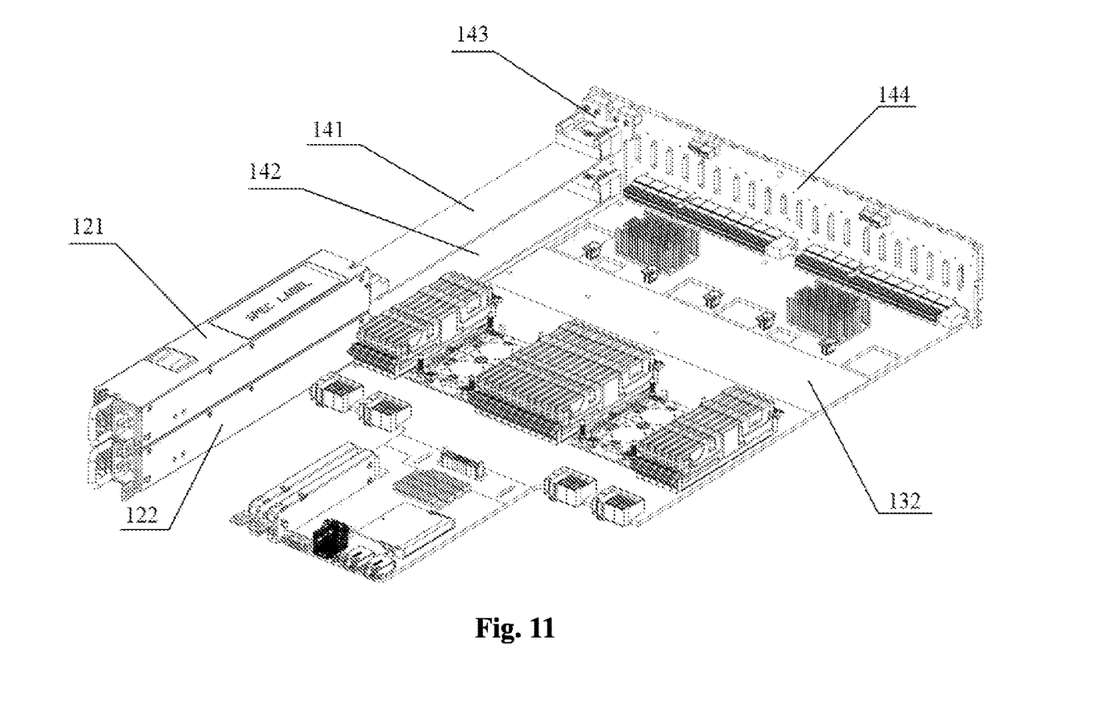
FIGS. 11 and 12 are schematic diagrams of the internal connection when the 2U chassis includes a full-width controller in the present disclosure.
Figure 12:
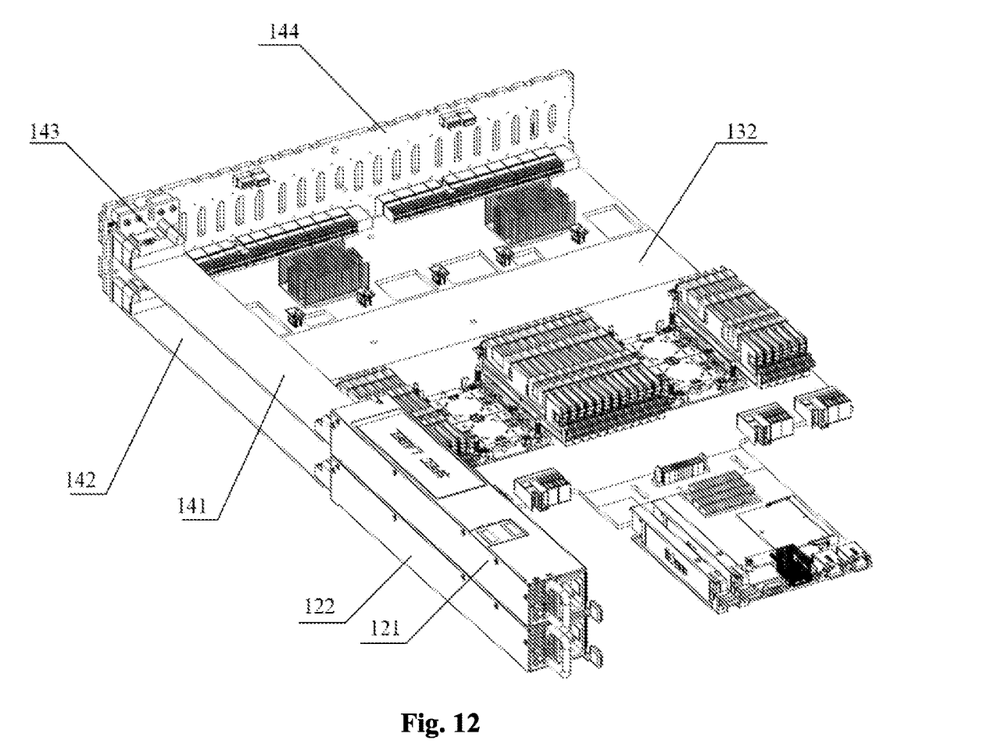

FIGS. 11 and 12 show schematic diagrams of the connection between the middle board 140, the power module 120, and the full-width controller 132. Specifically, in this embodiment, as shown in FIGS. 11 and 12, the middle board 140 includes: a first adapter board 141 and a second adapter board 142 connected with the two power supply units (the power supply unit 121 and the power supply unit 122) respectively, a power backplane 143 connected with the first adapter board 141 and the second adapter board 142 respectively, and a connection backplane 144 connected with the power backplane 143, the hard disk module 110 and the full-width controllers 132. The connection backplane 144 includes a connector connected with the hard disk module 110, a connector connected with the full-width controller 132, and heat dissipation holes for heat dissipation.

In this embodiment, the first adapter board 141 and the second adapter board 142 are respectively connected with a power supply unit, the power supply unit 121 and the power supply unit 122 are respectively connected with the power backplane 143, the power supply is connected with the hard disk module 110 and the full-width controller 132 on the connection backplane 144 through the power backplane 143.

Therefore, in this embodiment, the middle board 140 with electronic functions realizes the electrical connection between the power supply, the hard disk and the two full-width controllers 132, the internal layout of the chassis 100 is reasonable, simple and clean.

Embodiment 3

This embodiment provides a chassis 100. The chassis 100 includes a chassis body, a hard disk module 110, a power supply module 120, a controller module 130, and a middle board 140.

In this embodiment, the chassis 100 is a 4U chassis; the chassis body is a 4U chassis body.

"U" is a unit that represents the external dimensions of the chassis 100 and is an acronym for unit. The detailed dimensions are determined by the Electronic Industries Association (EIA), which is an industry group. The reason for specifying the size of the chassis 100 is to keep the chassis 100 at an appropriate size so as to be placed on an iron or aluminum rack. The rack includes screw holes for fixing the chassis 100. The screw holes of the rack are aligned with the screw holes of the chassis 100, and which are fixed with screws. The prescribed size of the chassis 100 includes a width (48.26 cm=19 inches) and a height (multiples of 4.445 cm). 1U is 4.445 cm. 2U is twice that of 1U, which is 8.89 cm. 4U is twice that of 2U, which is 17.8 cm.

Figure 15:
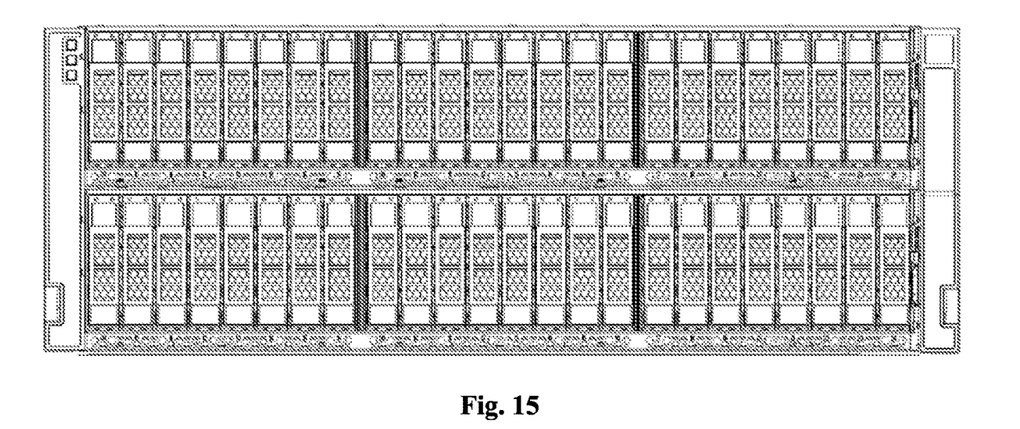
FIG. 15 is a schematic diagram of the front end when the 4U chassis includes two full-width controllers in the present disclosure.
Figure 16:
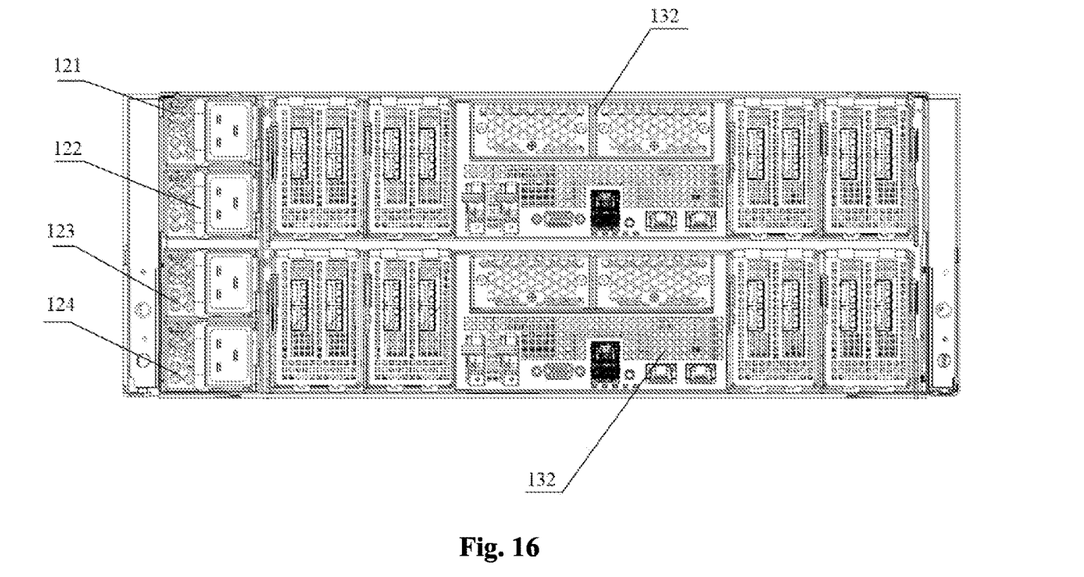
FIG. 16 is a schematic diagram of the rear end when the 4U chassis includes two full-width controllers in the present disclosure.
Figure 17:
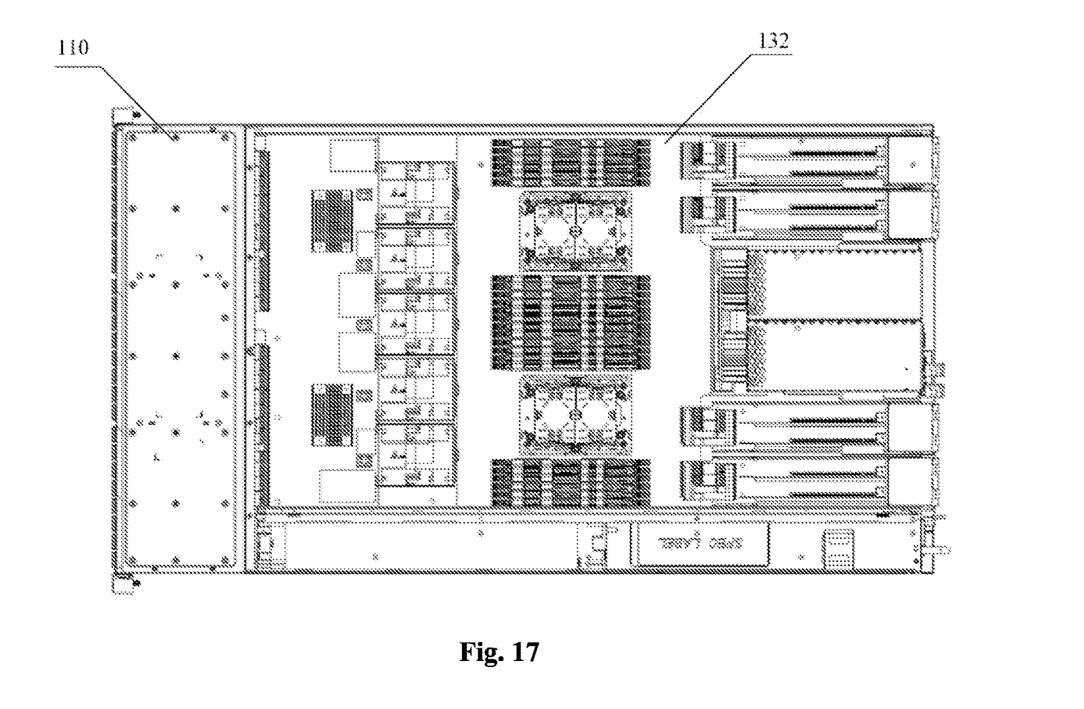
FIG. 17 is a top view of the 4U chassis including two stacked full-width controllers in the present disclosure.

Specifically, as shown in FIG. 15, the hard disk module 110 includes two layers of stacked hard disk sub-modules arranged in the front end area of the chassis body. The hard disk sub-modules include 0 to 48 hard disk units 111. That is, in this embodiment, the hard disk module 110 includes up to 48 hard disks. The arrangement of the hard disk units 111 in the chassis body is shown in FIG. 15. Preferably, the hard disk units 111 are arranged side-by-side.

In this embodiment, as shown in FIGS. 16 to 19, the power supply module 120 includes two layers of stacked power supply sub-modules installed at a side of the rear end area of the chassis body, and each layer of the power supply sub-module includes two stacked power supply units. That is, the power supply module 120 includes four power supply units: a power supply unit 121, a power supply unit 122, a power supply unit 123, and a power supply unit 124.

As shown in FIGS. 16 to 19, the controller module 130 includes two layers of controller sub-modules installed in a remaining rear end area of the chassis body except the power supply module, and in parallel with the power supply module 120, each of the controller sub-modules includes a full-width controller 130 with a width equal to a width of the remaining rear end area. In other words, the controller module 130 includes two stacked full-width controllers 132 installed in the remaining rear end area of the chassis body except the power supply module, and in parallel with the power supply module 120.

That is, in this embodiment, the 4U chassis 100 supports 48 or less, or no hard disks (solid state disk (SSD)) at the front end, and supports four power supply modules 120 and two full-width controllers 132 at the rear end.

In this embodiment, as shown in FIGS. 13 to 14, the full-width controller 132 includes: a main board 1321, U-shaped housing side plates (a side plate 1301 and a side plate 1302) arranged on two sides of the main board, two parallel BBU modules 1322 arranged in the middle of an end of the main board 1321 to provide power supply when power is off, two M.2 interface modules 1323 arranged side by side under each of the BBU modules, four PCI-E modules 1324 arranged outside and parallel with the BBU module 1322, a plurality of DIMMs 1325, preferably 24 DIMMs, two CPU modules (a CPU module 1326 and a CPU module 1327), and five fan modules 1328 arranged in the middle of the main board. In addition, the full-width controller 132 further includes an interface module 1329 for connecting with external devices, and a connector module 1303 for connecting with the middle board 140.

The plurality of pluggable functional modules: the BBU module 1322, the M.2 interface module 1323, the PCI-E module 1324, the DIMM 1325, the CPU module and the fan modules 1328 are all snap-fit structures, which are pluggably connected with the main board 1321 through golden fingers or connectors, and can be disassembled and assembled with bare hands. The modules can be taken out of the chassis 100 directly when replacing or maintaining.

In this embodiment, the BBU module 1322, the M.2 interface module 1323, the PCI-E module 1324, the DIMM 1325, the CPU module, and the fan module 1328 in the full-width controller 132 have the same dimensions as the BBU module 1322, the M.2 interface module 1323, the PCI-E module 1324, the DIMM 1325, the CPU module, and the fan module 1328 in the full-width controller 132 in Embodiment 2. The full-width controller 132 can be exchanged and shared in the 2U chassis 100 and the 4U chassis 100. The functional modules in the full-width controller 132 in the 4U chassis 100 are pluggable, the functional module are shared, which can be pulled out directly from the rear end of the 4U chassis 100, making the modules in the full-width controller 132 of the 4U chassis 100 can be exchanged with the modules in the full-width controller 132 of the 2U chassis 100, so as to improve the versatility of the modules in the chassis 100.

In this embodiment, the full-width controller 132 is connected the middle board 140 through connector interfaces. For example, the connector interface of the full-width controller 132 is a male interface, and the connector interface of the middle board 140 is a female interface. The full-width controller 132 is connected with the middle board 140 by the mating connection of the male interface and the female interface.

Figure 18:
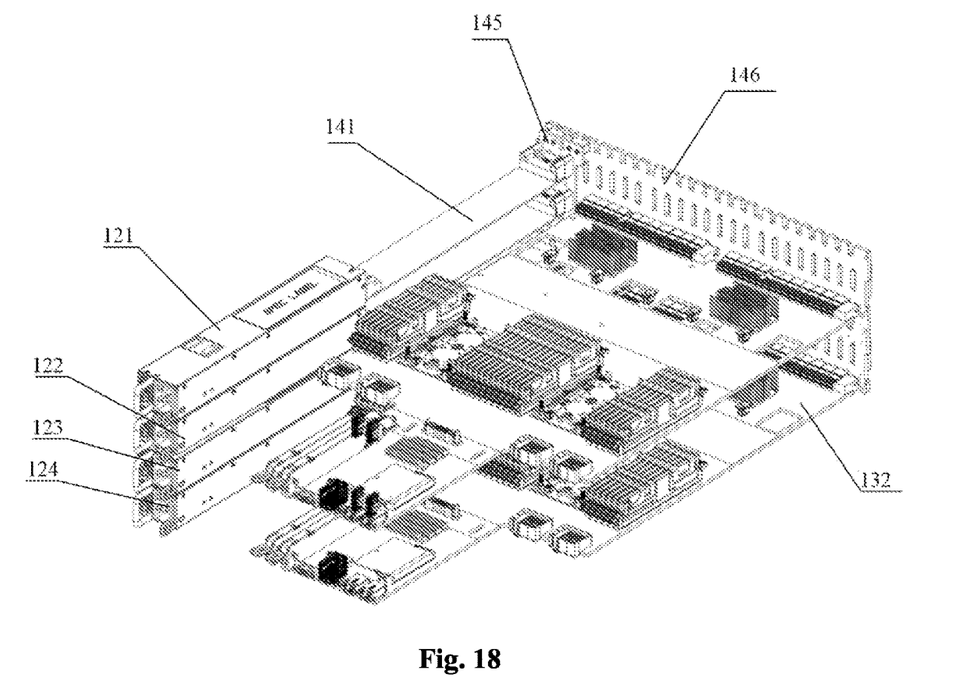
FIGS. 18 and 19 are schematic diagrams of the internal connection when the 4U chassis includes two full-width controllers in the present disclosure.
Figure 19:
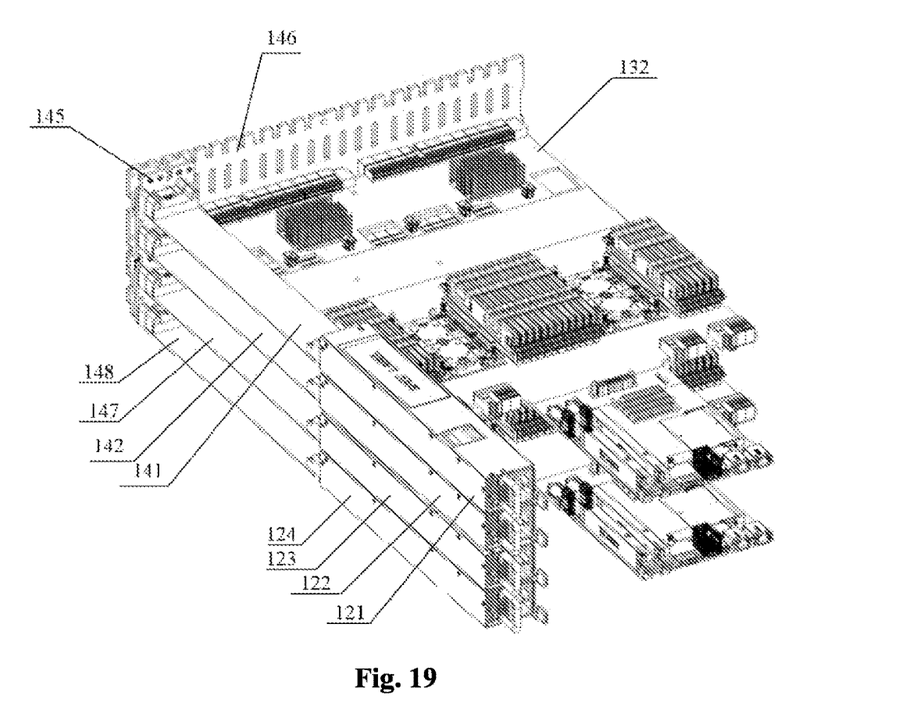

In this embodiment, as shown in FIGS. 18 and 19, the middle board 140 includes: a first adapter board 141, a second adapter board 142, a third adapter board 147, and a fourth adapter board 148 which are connected with four corresponding power supply units (the power supply unit 121, the power supply unit 122, the power supply unit 123, and the power supply unit 124), a power supply backplane connected with the first adapter board 141, the second adapter board 142, the third adapter board 147, and the fourth adapter board 148, and a connection backplane connected with the power supply backplane, the hard disk module 110, and the full-width controller 132. The connection backplane includes a connector connected with the hard disk module 110, a connector connected with the full-width controller 132, and heat dissipation holes for heat dissipation.

In this embodiment, the first adapter board 141, the second adapter board 142, the third adapter board 147, and the fourth adapter board 148 are respectively connected with a power supply unit, so that the power supply unit 121, the power supply unit 122, the power supply unit 123 and the power supply unit 124 are connected with the power supply backplane. The power supply is connected with the hard disk module 110 and the full-width controller 132 on the connection backplane through the power supply backplane.

Therefore, in this embodiment, the middle board 140 with electronic functions realizes the electrical connection between the power supply, the hard disk and the two full-width controllers 132, the internal layout of the chassis 100 is reasonable, simple and clean.

Embodiment 4

The present disclosure further provides an electronic device. The electronic device applies the 2U chassis described in Embodiment 1 or Embodiment 2, or applies the 4U chassis described in Embodiment 3.

The electronic device is a server, a memory or an industrial computer, etc. The 2U chassis and the 4U chassis have been described in detail above, and the chassis in the electronic device will not be repeated herein.

In addition, in order to highlight the innovative part of the present disclosure, technical features that are not closely related to solving the technical problems proposed by the present disclosure are not introduced in this embodiment, but this does not indicate that there are no other structures and features in this embodiment.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

In summary, in the present disclosure, the functional modules in the controller in the chassis are pluggable, so that the functional modules are shared, which can be pulled out directly from the rear end of the chassis, the modules in different chassis can be exchanged. In addition, the full-width controllers in the 2U chassis and 4U chassis can be exchanged, which improves the versatility of the chassis modules. In the present disclosure, the electrical connection between the power supply, the hard disk and the controller is realized through a middle board with electronic functions, so that the internal layout of the chassis is reasonable, simple and clean. Therefore, the present disclosure has wide applicability. Therefore, the present disclosure effectively overcomes various shortcomings in the prior art and has high industrial value.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those skilled in the art without departing from the spirit and scope of the disclosure will be covered by the appended claims.

The invention claimed is:

1. A chassis, comprising:
   a chassis body, wherein the chassis body is a 2U chassis body or a 4U chassis body;
   a hard disk module, installed in a front end area of the chassis body;
   a power supply module, installed at one side of a rear end area of the chassis body;
   a controller module, installed in a remaining rear end area of the chassis body except the power supply module, in parallel with the power supply module, and including a plurality of pluggable functional modules; and
   a middle board connected with the power supply module, the hard disk module, and the control module, respectively, to realize an electrical connection between the power supply module, the hard disk module, and the control module;
   wherein the chassis body is the 2U chassis body, the power supply module includes two stacked power supply units, the middle board comprises:
      a first adapter board and a second adapter board, respectively connected to the two power supply units;
      a power supply backplane, directly connected to the first adapter board and the second adapter board; and
      a connection backplane, respectively connected to the power supply backplane, the hard disk module, and the controller module; or
   wherein the chassis body is the 4U chassis body, the power supply module includes two layers of stacked power supply sub-modules installed at one side of the rear end area of the chassis body, and each layer of the power supply sub-module includes two stacked power supply units; the middle board comprises:
      a first adapter board, a second adapter board, a third adapter board, and a fourth adapter, respectively connected to four power supply units,
      a power supply backplane, connected to the first adapter board, the second adapter board, the third adapter board, and the fourth adapter board; and
      a connection backplane, connected to the power supply backplane, the hard disk module, and the controller module;
   wherein the plurality of pluggable functional modules comprises: a battery backup module, an M.2 interface module, a PCI-E module, a dual-inline-memory module, a CPU module and a fan module are pluggably connected with a main board in the controller module.

2. The chassis according to claim 1, wherein the chassis body is the 2U chassis body, wherein
   the hard disk module includes 0 to 24 hard disk units arranged in the front end area of the chassis body; and
   the controller module includes two half-width controllers, a width of the controller is half of a width of the remaining rear end area.

3. The chassis according to claim 2, wherein the half-width controller comprises:
   the main board;
   U-shaped housing side plates, arranged on both sides of the main board;
   a battery backup module, arranged at an end of the main board, the battery backup module provides power supply when power is off;
   two stacked M.2 interface modules adjacent to the battery backup module;
   two PCI-E modules, in parallel with the battery backup module and the two M.2 interface modules; and
   a plurality of dual-inline-memory modules, a CPU module and three fan modules arranged in the middle of the main board.

4. The chassis according to claim 1, wherein the chassis body is the 2 U chassis body, wherein
   the hard disk module includes 0 to 24 hard disk units arranged in the front end area of the chassis body; and
   the controller module includes a full-width controller with a width equal to a width of the remaining rear end area.

5. The chassis according to claim 1, wherein the chassis body is the 4 U chassis body,
   the hard disk module includes two layers of stacked hard disk sub-modules arranged in the front end area of the chassis body, and the hard disk sub-modules include 0 to 48 hard disk units; and
   the controller module includes two layers of controller sub-modules installed in a remaining rear end area of the chassis body except the power supply module and in parallel with the power supply module, each of the controller sub-modules includes a full-width controller with a width equal to a width of the remaining rear end area.

6. The chassis according to claim 4, wherein the full-width controller comprises:
   the main board;
   U-shaped housing side plates, arranged on both sides of the main board,
   two battery backup modules, arranged at one end of the main board and in the middle of the end, the two battery backup module are parallel with each other and provides power supply when power is off;
   two M.2 interface modules arranged side by side under and disposed below the battery backup modules,
   four PCI-E modules arranged outside and parallel with the battery backup module; and
   a plurality of dual-inline-memory modules, two CPU module and five fan modules arranged in the middle of the main board.

7. The chassis according to claim 1, wherein
   the controller module includes two half-width controllers, a width of each of the controllers is half of a width of the remaining rear end area or includes a full-width controller with a width equal to a width of the remaining rear end area, wherein
   the size of the functional modules in the half-width controller is the same as that of the corresponding functional modules in the full-width controller; and
   wherein the chassis body is 2U chassis body, the 2U chassis body is configured to include the full-width controller; or wherein the chassis body is 4U chassis body, the 4U chassis body is configured to include the full-width controller.

8. An electronic device, wherein the electronic device applies the chassis according to claim 1.

* * * * *